United States Patent
Hsieh et al.

(10) Patent No.: US 6,905,968 B2
(45) Date of Patent: Jun. 14, 2005

(54) PROCESS FOR SELECTIVELY ETCHING DIELECTRIC LAYERS

(75) Inventors: Chang-Lin Hsieh, San Jose, CA (US); Jie Yuan, San Jose, CA (US); Hui Chen, San Jose, CA (US); Theodoros Panagopoulos, Cupertino, CA (US); Yan Ye, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 161 days.

(21) Appl. No.: 10/016,562

(22) Filed: Dec. 12, 2001

(65) Prior Publication Data

US 2003/0109143 A1 Jun. 12, 2003

(51) Int. Cl.$^7$ .................... H01L 21/302; H01L 21/461
(52) U.S. Cl. .................... 438/706; 438/714; 438/723; 438/725
(58) Field of Search .................... 438/700, 706, 438/712, 714, 723, 725

(56) References Cited

U.S. PATENT DOCUMENTS

| | | | |
|---|---|---|---|
| 5,445,710 A | 8/1995 | Hori et al. .................... 438/717 |
| 5,935,874 A | 8/1999 | Kennard .................... 438/710 |
| 6,054,379 A | 4/2000 | Yau et al. .................... 438/623 |
| 6,071,809 A | 6/2000 | Zhao .................... 438/634 |
| 6,072,227 A | 6/2000 | Yau et al. .................... 257/642 |
| 6,097,095 A | 8/2000 | Chung .................... 257/774 |
| 6,165,891 A | 12/2000 | Chooi et al. .................... 438/622 |
| 6,168,726 B1 * | 1/2001 | Li et al. .................... 216/79 |
| 6,180,533 B1 | 1/2001 | Jain et al. .................... 438/714 |
| 6,194,128 B1 * | 2/2001 | Tao et al. .................... 430/313 |
| 6,207,583 B1 | 3/2001 | Dunne et al. .................... 438/725 |
| 6,211,092 B1 | 4/2001 | Tang et al. .................... 438/719 |
| 6,228,758 B1 | 5/2001 | Pellerin et al. .................... 438/624 |
| 6,245,690 B1 * | 6/2001 | Yau et al. .................... 438/780 |
| 6,251,770 B1 | 6/2001 | Uglow et al. .................... 438/624 |
| 6,455,411 B1 * | 9/2002 | Jiang et al. .................... 438/624 |
| 6,573,187 B1 * | 6/2003 | Chen et al. .................... 438/692 |
| 2002/0061654 A1 | 5/2002 | Kanegae et al. .................... 438/710 |
| 2002/0076935 A1 * | 6/2002 | Maex et al. .................... 438/706 |
| 2003/0024902 A1 * | 2/2003 | Le et al. .................... 216/67 |
| 2003/0077897 A1 * | 4/2003 | Tsai et al. .................... 438/633 |

FOREIGN PATENT DOCUMENTS

| | | | |
|---|---|---|---|
| EP | 0 805 485 A2 | 4/1997 | .......... H01L/21/311 |
| EP | 1 059 664 A2 | 6/2000 | .......... H01L/21/312 |
| EP | 1 085 563 A2 | 9/2000 | .......... H01L/21/311 |
| JP | 2001210627 | 3/2001 | ....... H01L/21/3065 |
| WO | WO 02/19408 A2 | 3/2002 | .......... H01L/21/311 |

* cited by examiner

Primary Examiner—Duy-Vu N. Deo
(74) Attorney, Agent, or Firm—Mayer, Fortkort & Williams; Joseph Bach (57) ABSTRACT

A method is provided for etching a dielectric structure. The dielectric structure comprises: (a) a layer of undoped silicon oxide or F-doped silicon oxide; and (b) a layer of C,H-doped silicon oxide. The dielectric structure is etched in a plasma-etching step, which plasma-etching step is conducted using a plasma source gas that comprises nitrogen atoms and fluorine atoms. As one example, the plasma source gas can comprise a gaseous species that comprises one or more nitrogen atoms and one or more fluorine atoms (e.g., $NF_3$). As another example, the plasma source gas can comprise (a) a gaseous species that comprises one or more nitrogen atoms (e.g., $N_2$) and (b) a gaseous species that comprises one or more fluorine atoms (e.g., a fluorocarbon gas such as $CF_4$). In this etching step, the layer of C,H-doped silicon oxide is preferentially etched relative to the layer of undoped silicon oxide or F-doped silicon oxide. The method of the present invention is applicable, for example, to dual damascene structures.

24 Claims, 5 Drawing Sheets

PROCESS FOR SELECTIVELY ETCHING DIELECTRIC LAYERS

BACKGROUND OF THE INVENTION

The present invention relates to processes for selectively etching dielectric layers, for example, in the context of a dual damascene process.

The technology of fabricating semiconductor integrated circuits continues to advance in the number of transistors, diodes, capacitors and/or other electronic devices that can be fabricated on a single integrated circuit chip. This increasing level of integration is being accomplished in large part by decreasing minimum feature sizes.

Advanced integrated circuits contain multiple interconnect layers separated from the semiconductor substrate and from each other by respective dielectric layers. For instance, logic circuitry, such as that found in microprocessors, requires several interconnect layers with intervening dielectric layers. A horizontal interconnect layer is formed over one dielectric layer and then covered by another dielectric layer. Small contact or via holes need to be etched through each of the dielectric layers to connect the interconnect layers.

Several techniques are employed to create interconnect lines and vias. One such technique involves a process generally referred to as a "dual damascene process." This process includes forming a trench and an underlying via hole, whereupon the trench and the via hole are filled with a conductor material, simultaneously forming an interconnect line and an underlying via.

One particular dual damascene process will now be described with reference to FIGS. 1A–1F, which are taken from U.S. Pat. No. 6,211,092, the entire disclosure of which is incorporated by reference. An etching structure is formed that comprises the following layers: (a) an underlying layer 10, (b) a thin lower stop layer 12, (c) a lower dielectric layer 14, (d) a thin upper stop layer 16 and (e) an upper dielectric layer 20. The stop layers 12, 16 have compositions relative to the dielectric layer 14, 20 compositions such that a selected etch process etches through the overlying dielectric layer but stops on the stop layer.

Figure 1A:
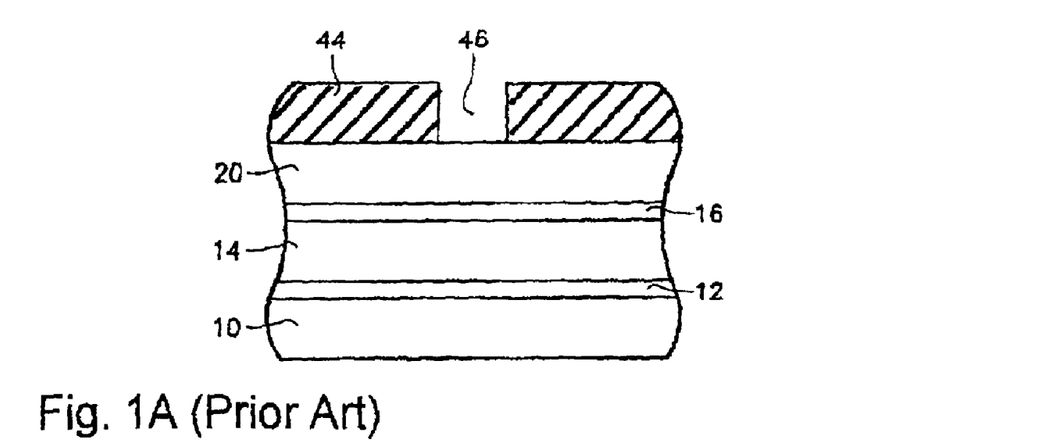
FIGS. 1A–1F are schematic partial cross-sectional views illustrating a dual damascene process that is known in the prior art.

Examples of materials for the dielectric layers 14, 20 that are known in the art include doped and undoped silicon oxide materials. Undoped silicon oxide materials are typically of the formula $SiO_x$, wherein x is between 1.4 and 2.1, with silicon dioxide (where x is approximately 2) being most prevalent. Doped silicon oxide materials are materials containing silicon, oxygen and one or more additional species. These layers can be grown, for example, by chemical vapor deposition (CVD) or plasma-enhanced chemical vapor deposition (PECVD).

Silicon nitride is a typical stop layer material where the dielectric is a silicon oxide material. Silicon nitride can be grown, for example, by CVD or PECVD.

A first photoresist layer 44 is deposited and photographically patterned to form mask apertures 46 corresponding to the via holes, only one of which is illustrated. Note that the underlying layer 10 typically includes dielectric and metal regions, with a metal region being found in the area of the hole.

Figure 1B:
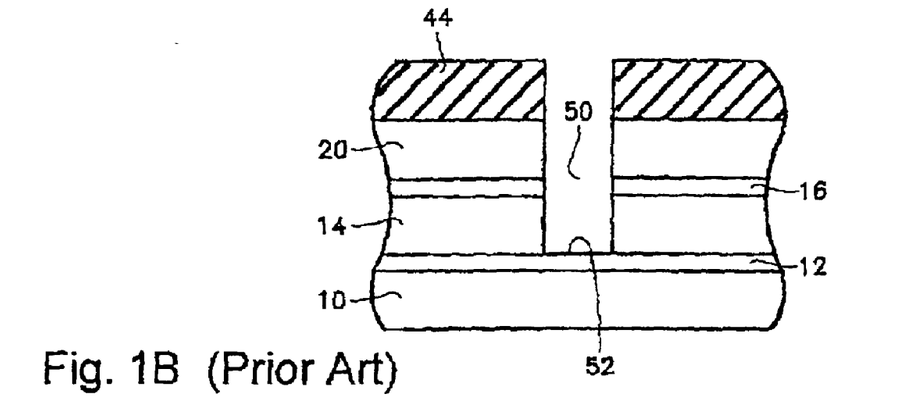

In a first etch step, an extended via hole 50, as illustrated in FIG. 1B, is etched through the upper dielectric layer 20, the upper stop layer 16, and the lower dielectric layer 14 down to the lower stop layer 12. The etch chemistry is chosen to be selective such that the etch stops at the top surface 52 of the lower stop layer 12. For example, in a first step, a non-selective timed etch can be used to etch the via hole 50 through the upper dielectric layer 20, the upper nitride stop layer 16, and part of the way through the lower dielectric layer 14. A second etch step with good oxide:nitride selectivity can then be used to selectively etch the remainder of the way through the lower dielectric layer 14 and stop on the upper surface 52 of the lower stop layer 12, completing the extended via hole 50.

Figure 1C:
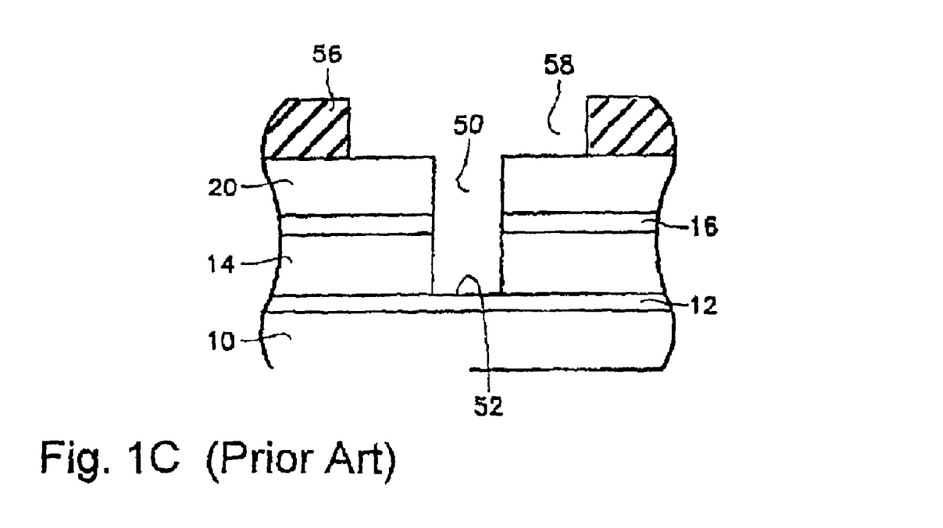
Figure 1D:
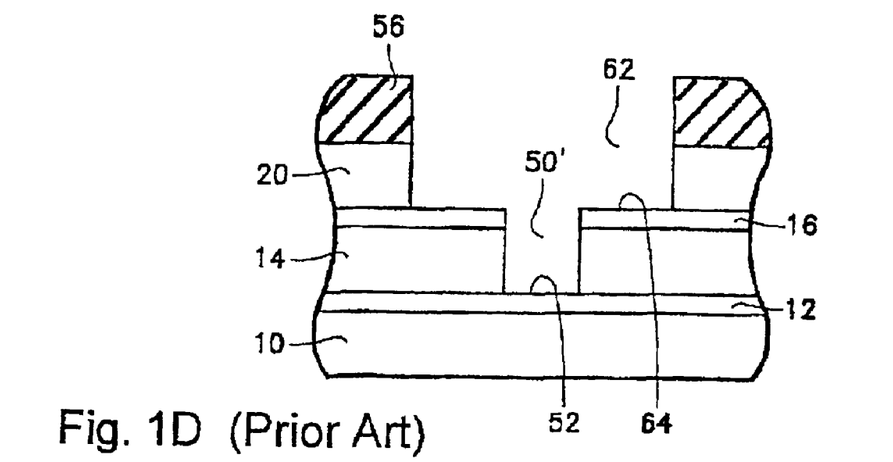

In an unillustrated step, the first photoresist layer 44 is stripped. Then, as illustrated in FIG. 1C, a second photoresist layer 56 is deposited and photographically patterned to form a mask aperture 58, which corresponds to the trench. In a subsequent etch step illustrated in FIG. 1D, a trench 62 is etched through the upper dielectric layer 20 down to the top surface 64 of the upper stop layer 16. The depth of the extended via hole 50 is thereby effectively reduced to form via hole 50'.

Figure 1E:
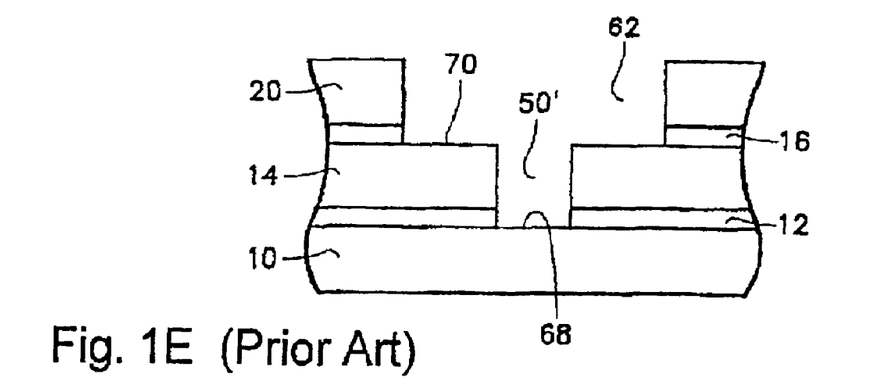

In a further etch step, the exposed portion of the lower stop layer 12 at the bottom of the via hole 50' is etched, as illustrated in FIG. 1E, through the lower stop layer 12 and down to an upper surface 68 of the underlying layer 10, which is typically a metal surface, at least at the position of the via hole 50'. Depending upon the compositions of the two stop layers 12, 16, this etch step may remove portions of the upper stop layer 16 exposed at the bottom of the trench 62 to expose an upper surface 70 of the lower dielectric layer 14. In another step, performed either before or after this etch step, the second photoresist layer 56 is stripped along with any sidewall polymer formed in the dielectric etch.

Figure 1F:
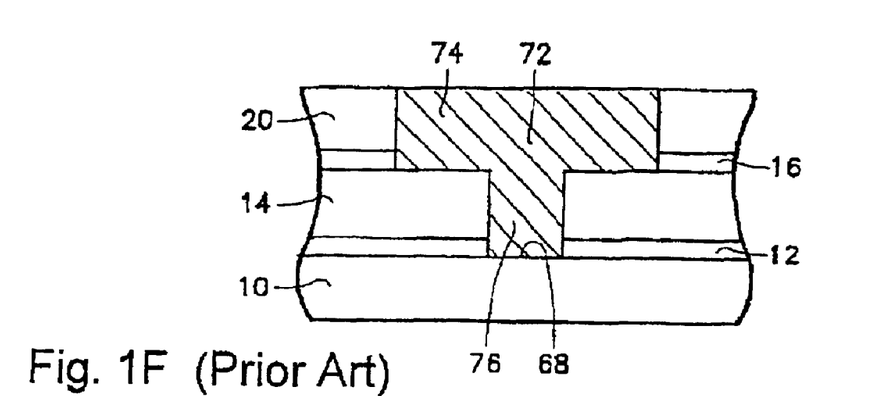

Thereafter, as illustrated in FIG. 1F, a metal 72 is filled into the trench 62 and the underlying via hole 50' to contact the upper surface 68 of the underlying layer 10. Subsequent chemical mechanical polishing (CMP) removes any metal overflowing the trench. The metal 72 forms both a horizontal interconnect line 74 as well as a via 76, which contacts the underlying layer 10. The metal 72 is preferably copper, but can be another metal such as aluminum. However, the dual-damascene process is particularly applicable to copper metallization because no copper etching is required.

It is generally desirable for the dielectric constant k of the non-metallic materials used within the dual damascene structure to be as low as possible. For example, a reduced dielectric constant k results in reduced capacitance, which in turn reduces cross-talk and coupling, allowing for increased operating speeds. Unfortunately, the materials that are typically used in connection with the stop layers 12, 16 (e.g., silicon nitride) are relatively high-dielectric-constant k materials. For example, the dielectric constant k for $Si_3N_4$ is about 7.5. (This is to be contrasted, for example, with the dielectric constant k of silicon dioxide, which is typically between 3.9 and 4.2.)

Hence, there is a need in the art for a dual damascene structure in which the adverse impact of such relatively high dielectric constant k materials is reduced.

SUMMARY OF THE INVENTION

The above and other difficulties of present day integrated circuit dielectric etching processes are addressed by the present invention.

According to an embodiment of the invention, a method is provided for etching a dielectric structure. The dielectric structure comprises: (a) a first dielectric layer of undoped silicon oxide or F-doped silicon oxide and (b) a second dielectric layer of C,H-doped silicon oxide. The dielectric structure is then etched in a plasma-etching step, which is conducted using a plasma source gas that comprises nitrogen atoms and fluorine atoms. The second dielectric layer is selectively etched relative to the first dielectric layer in this etching step providing, for example, a second-dielectric-layer:first-dielectric-layer selectivity of 2.5:1 or greater, more preferably 3:1 or greater.

According to another embodiment of the invention, a method is provided for etching a trench in a dual damascene structure. The dual damascene structure comprises: (a) an underlying layer, (b) a via dielectric layer of either undoped silicon oxide or F-doped silicon oxide over the underlying layer, (c) a trench dielectric layer of C,H-doped silicon oxide over the via dielectric layer, and (d) a patterned masking layer over the trench dielectric layer. The dual damascene structure also preferably comprises an extended via hole that extends through the trench dielectric layer and the via dielectric layer. One or more trenches are then etched within the trench dielectric layer by a plasma-etching step. Etching is conducted through apertures formed in the patterned masking layer, with etching continuing until a portion of an upper surface of the via dielectric layer is exposed. The plasma-etching step is conducted using a plasma source gas that comprises nitrogen atoms and fluorine atoms. Analogous to the embodiment in the prior paragraph, the trench dielectric layer is preferably selectively etched relative to the via dielectric layer providing, for example, a trench-dielectric-layer:via-dielectric-layer selectivity of 2.5:1 or greater, more preferably 3:1 or greater.

In some embodiments, the plasma source gas will comprise a gaseous species that comprises one or more nitrogen atoms and one or more fluorine atoms (e.g., $NF_3$). In other embodiments, the plasma source gas will comprise (a) a gaseous species that comprises one or more nitrogen atoms (e.g., $N_2$) and (b) a gaseous species that comprises one or more fluorine atoms (e.g., a fluorocarbon gas such as $CF_4$).

The undoped silicon oxide layer is preferably a silicon dioxide layer, while the F-doped silicon oxide layer is preferably a fluorinated silica glass layer.

In some embodiments, the plasma-etching step is conducted within a magnetically enhanced reactive ion etching system.

One advantage of the present invention is that a C,H-doped silicon oxide dielectric layer can be preferentially etched relative to an undoped silicon oxide dielectric layer and an F-doped silicon oxide dielectric layer.

Another advantage of the present invention is that an etch stop layer having a relatively high dielectric constant can be eliminated from known dual damascene structures. As a result, the capacitance of the structure is reduced. This in turn reduces cross-talk and coupling, allowing for increased device operating speeds.

The above and other embodiments and advantages of the present invention will become apparent to those of ordinary skill in the art upon reading the detailed description and claims to follow.

DETAILED DESCRIPTION

As a preface to the detailed description, it should be noted that, all percentages (%) listed for gas constituents are % by volume, and all ratios listed for gas constituents are volume ratios.

The term "selectivity" is used to refer to a) a ratio of etch rates of two or more materials and b) a condition achieved during etch when the etch rate of one material is increased in comparison with another material.

The present invention now will be described more fully hereinafter with reference to the Figures, in which exemplary embodiments of the present invention are shown. This invention, however, may be embodied in different forms and should not be construed as limited to the embodiments set forth herein.

Figure 2A:
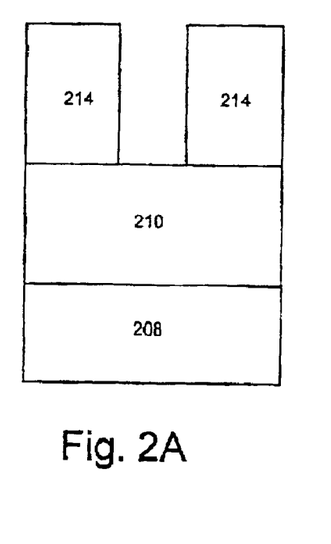
FIGS. 2A–2B are schematic partial cross-sectional views illustrating an etching process according to an embodiment of the present invention.
Figure 2B:
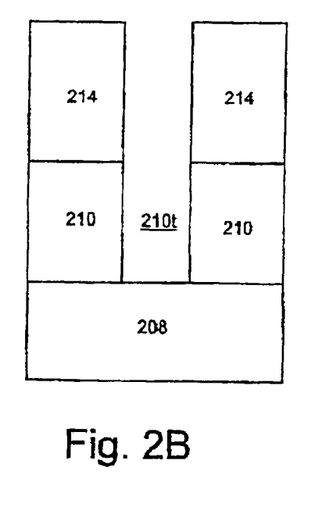

A process in accordance with an embodiment of the invention will now be discussed in connection with FIGS. 2A and 2B. Referring to FIG. 2A, a structure is illustrated which includes a lower dielectric layer 208, an upper dielectric layer 210 and a patterned masking layer 214. The lower dielectric layer 208 is composed of a silicon oxide, for example, silicon dioxide (typically formed from tetraethylorthosilicate, also known as TEOS), or a fluorine-doped silicon oxide, for example, fluorinated silica glass (FSG). As noted above, the dielectric constant k for silicon dioxide is typically between 3.9 and 4.2. The dielectric constant k for fluorinated silica glass, on the other hand, is about 3.5. For this reason fluorinated silica glass may be preferable to silicon dioxide in some cases. The lower dielectric layer 208 can be of any suitable thickness appropriate for the application at hand, and it can be formed, for example, using CVD processes as is known in the art.

The upper dielectric layer 210 is provided over the lower dielectric layer 208. The upper layer in this embodiment is silicon oxide that is doped with carbon and hydrogen (referred to herein as "C,H-doped silicon oxide"). The upper layer 210 can be of any suitable thickness appropriate for the application at hand. Yau et al. have recently described a method of forming such an oxidized carbon-silicon material in U.S. Pat. Nos. 6,054,379 and 6,072,227, both of which are incorporated by reference in their entireties. This film has also been described in U.S. Pat. No. 6,168,726, the entire disclosure of which is incorporated by reference. The layer is preferably made using a chemical vapor deposition (CVD) process with gaseous precursors of an organo-silane and an oxidizer to form a low-k dielectric having a dielectric constant in the range of 2.5 to 3. The CVD process is preferably carried out in a low-power capacitively coupled plasma having a power density on the wafer of less than 1 $W/cm^2$ and at a temperature of less than 100° C. The preferred hydrogen content is at least 30 atomic %, more preferably between 45 and 60 atomic %, the preferred carbon content is between 5 and 20 atomic %, more preferably between 6 and 10 atomic %, the preferred silicon content is preferably between 15 and 30 atomic %, more preferably between 17 and 22 atomic %, and the preferred oxygen content is between 10 and 45 atomic %, more preferably between 15 and 30 atomic %. A C,H-doped silicon oxide material is presently sold by Applied Materials, Inc. of Santa Clara, Calif. under the trade name of Black Diamond™.

The patterned masking layer 214 is provided over the upper layer 210. The patterned masking layer 214 is preferably an organic photoresist layer. The patterned masking layer 214 can be of any thickness suitable to maintain the presence of the masking layer 214 during the subsequent etching process, in which the structure of FIG. 2A is etched to form a trench 210t as illustrated in FIG. 2B.

The etching processes of the present invention may be conducted in any suitable plasma processing apparatus, for example, a reactive ion etching (RIE) apparatus. A traditional reactive ion etching apparatus contains an anode and cathode within a vacuum chamber. The cathode is typically in the form of a pedestal for supporting a semiconductor wafer within the chamber, while the anode is typically formed of the walls and/or top of the chamber. To process a wafer, a plasma source gas is pumped into the vacuum chamber and the anode and cathode are driven by a single sinusoidal frequency (RF) source to excite the plasma source gas into a plasma. The single frequency is typically 13.56 MHz, although frequencies from 100 kHz to 2.45 GHz are often used, with the occasional use of other frequencies. The RF power excites the plasma source gas, producing a plasma within the chamber proximate the semiconductor wafer being processed.

The plasma processing apparatus may also be a magnetically enhanced reactive ion etch (MERIE) apparatus. Such an apparatus is typically provided with one or more magnets or magnetic coils that magnetically control the plasma to facilitate a more uniform etch process.

One particular MERIE chamber for use in connection with the present invention is the eMax™ chamber, which is available from Applied Materials, Inc. of Santa Clara Calif.

The etching chemistry used in this process step is preferably based on a plasma source gas that contains nitrogen atoms and fluorine atoms. As one example, $NF_3$ gas can be used. As another example, a mixture of (a) a gas species containing nitrogen atoms and (b) a gas species containing fluorine atoms can be used. For instance a plasma source gas containing a mixture of $N_2$ gas and one or more fluorocarbon gases (defined here as a gas that contains carbon and fluorine atoms) can be used, more preferably a mixture of $N_2$ gas and one or more fluorocarbon gases that contain only carbon and fluorine atoms, for example, $CF_4$ gas, $C_2F_6$ gas or $C_4F_8$ gas.

This etching chemistry is attractive because good etch rates are achieved for the upper dielectric layer (for example, etch rates that are typically greater than 0.5 micron per minute, and preferably greater than 1 micron per minute, can be achieved). This etching chemistry is also attractive, because it provides a good selectivity between the upper dielectric layer 210 and the lower dielectric layer 208. This selectivity is typically 2.5:1 or greater, and preferably 3:1 or greater. As a result of this good selectivity, the lower dielectric layer can act as an etch stop layer for the upper dielectric layer etching process, so that a structure like that illustrated in FIG. 2B is produced.

As one specific example, acceptable selectivity and etch rates can be achieved by etching a structure like that illustrated in FIG. 2A in a MERIE chamber operated at relatively low power (e.g., <500 W, more preferably about 300 W) and a relatively high pressure (e.g. 150 mTorr or more) in the presence of a plasma source gas consisting of $N_2$ gas and $CF_4$ gas.

As another specific example, an acceptable etch rate and selectivity can be achieved by etching a structure like that illustrated in FIG. 2A in an eMax™ chamber operated at relatively high power (e.g., >500 W, more preferably 800 to 1200 W) and a relatively low pressure (e.g. <150 mTorr, more preferably 30–50 mTorr) in the presence of an $NF_3$ plasma source gas, which is preferably provided at a flow rate of 15 to 50 sccm (standard cubic centimeters to minute). The cathode temperature is maintained, for example, at 10–20° C. The preferred magnetic field ranges from 0–30 G. This process can achieve a C,H-doped silicon oxide etch rate of greater than 1 micron per minute and a C,H-doped-silicon-oxide:fluorinated-silica-glass selectivity of greater than 3:1.

Figure 3A:
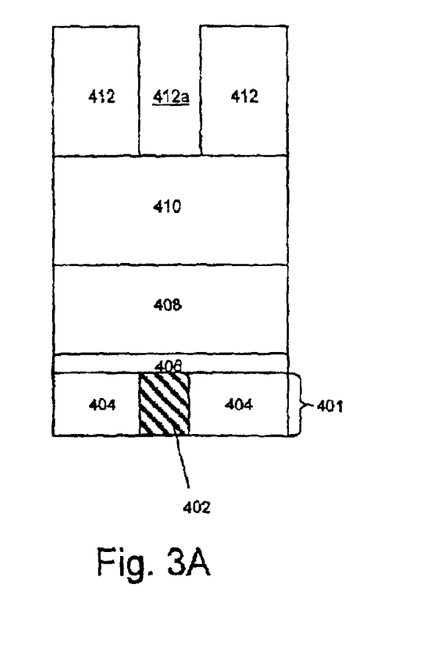
FIGS. 3A–3H are schematic partial cross-sectional views illustrating a dual damascene process according to an embodiment of the present invention.

Turning now to FIGS. 3A to 3H, these figures represent one specific dual damascene process for which the process of the present invention is useful. FIG. 3A illustrates a dual damascene structure, which includes an underlying layer 401. Underlying layer 401 typically comprises dielectric regions 404 and conductive regions 402, for example, copper regions.

Over the underlying layer 401 is deposited an etch stop layer 406. The etch stop layer 406 can be formed of any material that is an appropriate etch stop material for silicon oxide materials, including silicon carbide or silicon nitride (typically of the formula $SiN_x$, where x may vary somewhat over a range of, for example, 1 to 1.5 and is commonly $Si_3N_4$). The etch stop layer 406 can be of any thickness appropriate for its service as an etch stop layer, and it is 300 to 1000 Angstroms in thickness in this example. The etch stop layer 406 can be formed, for example, using CVD processes as is well known in the art.

Over the etch stop layer 406 is provided a via dielectric layer 408, which in this embodiment is composed of either (a) an undoped silicon oxide (typically formed from TEOS), for example, silicon dioxide, or (b) a fluorine-doped silicon oxide, for example, fluorinated silica glass. As previously noted, the dielectric constant k for silicon dioxide is typically between 3.9 and 4.2, while the dielectric constant k for fluorinated silica glass is about 3.5. The via dielectric layer 408 can be of any suitable thickness appropriate for its service as a via layer, and is, for example, 3000 to 5000 Angstroms in thickness in this case.

A trench dielectric layer 410 is provided over the via dielectric layer 408. The trench dielectric layer 410 in this embodiment is C,H-doped silicon oxide, whose composition, formation and properties are described above in connection with FIG. 2A. The trench dielectric layer 410 can be of any suitable thickness appropriate for its service as a trench dielectric layer, and is, for example, 3000 to 5000 Angstroms in thickness in this case.

Over the trench dielectric layer 410 is disposed a first patterned masking layer 412, which is preferably an organic photoresist layer. The thickness and aperture 412a size associated with the patterned masking layer 412 can be of any value suitable for etching a via hole. For example, the patterned masking layer can be an organic photoresist layer having a thickness of 4000 to 7000 Angstroms and an aperture of 0.2 to 0.5 microns.

Figures 3B, 3D:
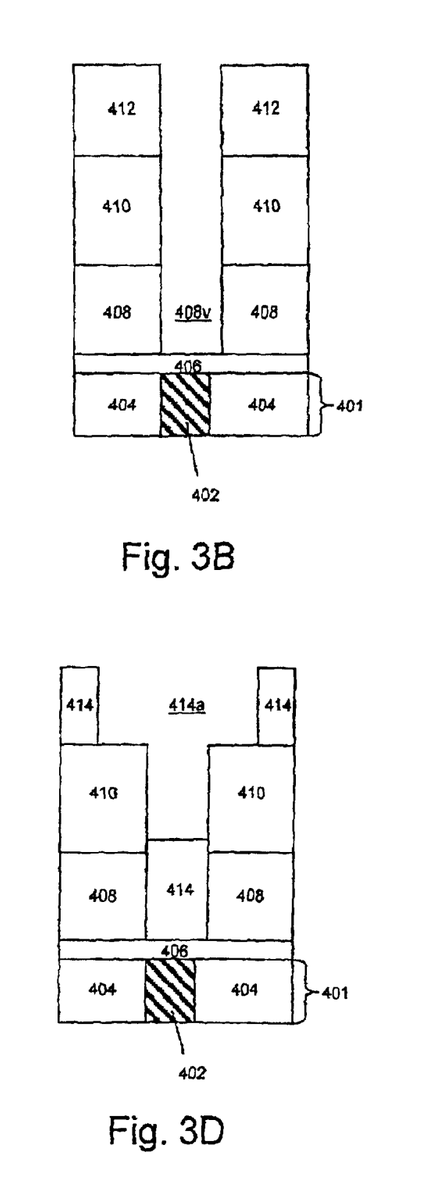
Figure 3C:
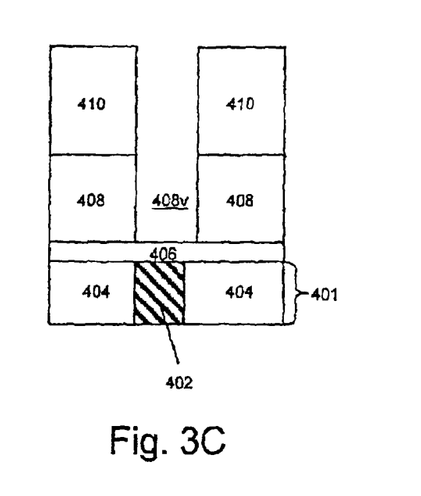

Once the structure of FIG. 3A is established, it is then subjected to an etching step in which an extended via hole 408v is etched down to the etch stop layer 406 as illustrated in FIG. 3B.

As above, the etching process may be conducted in any suitable plasma processing apparatus, for example, a plasma-enhanced reactive ion etching system such as a MERIE chamber. The etching chemistry for this process step can be essentially any etching chemistry that is known for etching silica-based materials with good selectivity vis-à-vis the etch stop layer 406. Exemplary etching chemistries for this process step are those that are based upon fluorine-containing gases, more preferably those based on fluorinated hydrocarbon gases (defined here as gases that contain carbon, hydrogen and fluorine atoms), for example, $CH_3F$ gas. After etching, a structure like that illustrated in FIG. 3B is produced. The patterned masking layer 412 is then stripped, producing structure like that illustrated in FIG. 3C.

Subsequently, a second patterned masking layer 414 is provided over the structure as illustrated in FIG. 3D. The second patterned masking layer 414 is, for example, an organic photoresist layer. The thickness and aperture 414a size associated with the patterned masking layer 414 can be of values suitable for etching an interconnect trench. For example, the patterned masking layer can be an organic photoresist layer having a thickness of 4000 to 7000 Angstroms and an aperture of 0.2 to 0.5 microns.

Figure 3E:
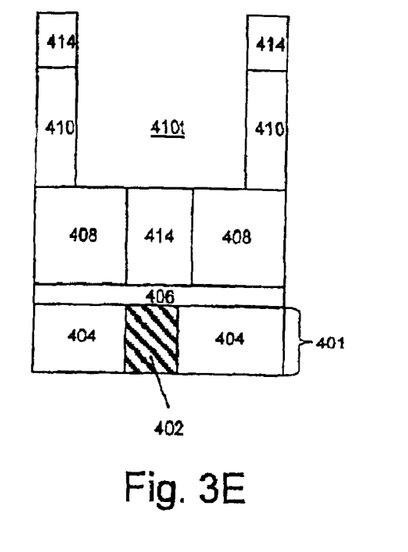

Turning now to FIG. 3E, a trench 410t is etched in the trench dielectric layer 410 using an etching process that selectively etches the trench dielectric layer 410 relative to the via dielectric layer 408. As discussed in more detail in connection with FIG. 2B above, the etching process may be conducted in any suitable plasma processing apparatus. As also discussed in more detail in connection with FIG. 2B above, the etching chemistry used in this process is preferably based on a plasma source gas that contains nitrogen atoms and fluorine atoms (for example, a $NF_3$ plasma source gas or a plasma source gas containing a mixture of $N_2$ gas and one or more fluorocarbon gases). Using this apparatus and etching chemistry, the trench dielectric layer 410 can be etched with a selectivity of 3:1 or greater relative to the via dielectric layer 408, while at the same time etching the trench dielectric layer 410 at a rate of more than 1 micron per minute.

As discussed above in connection with FIG. 1, although absent here, a material such as silicon nitride is commonly used in the prior art as an etch stop layer between the trench dielectric layer and the via dielectric layer to avoid problems such as corner faceting, micro-trenching and etch rate micro-loading. However, because silicon nitride has a dielectric constant k that is rather high (for example, the dielectric constant for $Si_3N_4$ is about 7.5), its elimination from the present structure is advantageous. As discussed in the prior paragraph, the trench dielectric layer 410 can be etched in the present invention at greater than 1 micron per minute while achieving a selectivity of 3:1 or greater. As a result, the etch stop layer that is found between the trench dielectric layer and the via dielectric layer in the prior art can be eliminated, without experiencing significant corner faceting, micro-trenching and etch rate micro-loading. (It is also seen from FIG. 3E that the presence of the masking layer 414 material within the via hole 408v previously etched in via dielectric layer 408 helps maintain the integrity of the shoulder regions of via dielectric layer 408.)

Figure 3F:
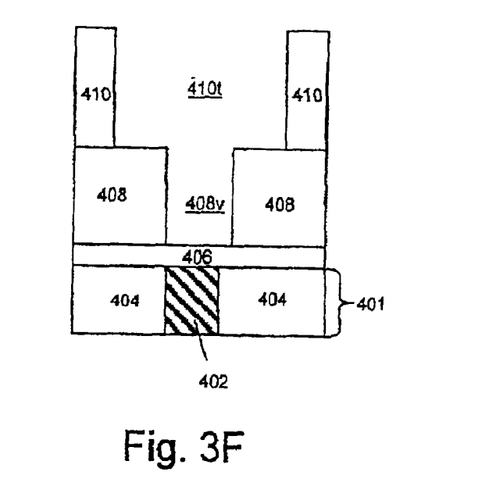

After the trench etching step, the remaining portions of the second patterned masking layer 414 are stripped to provide a structure like that illustrated in FIG. 3F.

Figure 3G:
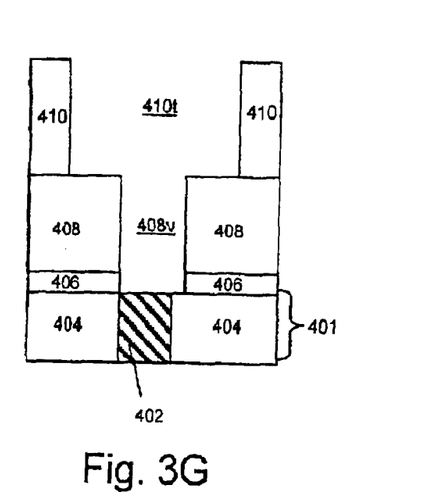

A further etching step is then performed to remove the etch stop layer 406 that lies at the bottom of the via hole 408v and thereby provide access to the underlying metal region 402. Etching chemistries are well known in the art for this purpose. For example, an etching chemistry containing a fluorohydrocarbon (e.g., $CHF_3$, $CH_2F_2$, $CH_3F$), $N_2$, $O_2$ and, optionally, argon can be used. The resulting structure is illustrated in FIG. 3G.

Figure 3H:
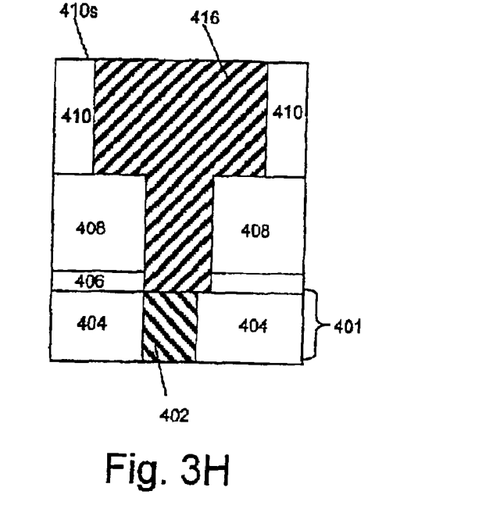

The trench 410t and via hole 408v are then filled with metal 416 (typically copper) in a metallization process as is well known in the art. The metallization process may require that the trench 410t and via hole 408v be coated with barrier layers and wetting layers, as has become well known in metallization of small features in advanced integrated circuits. The trench 410t and via hole 408v are typically filled in a metal deposition process that is usually at least partially performed by physical vapor deposition. Filling is typically continued until metal completely fills the via hole 408v and trench 410t and somewhat overlies the upper surface 410s as well. Chemical mechanical polishing is then typically performed. Because silicon-oxide-based materials are much harder than metal, the polishing essentially stops when it encounters the upper surface 410s of the trench dielectric layer 410.

While FIGS. 3A to 3H represent a particular dual damascene process for which the process of the present invention is useful, numerous processes are known, including other dual damascene processes an other non-damascene processes, wherein good etching selectivity between two dielectric layers is required. Hence the process of the present invention is applicable to these processes as well.

Although various embodiments are specifically illustrated and described herein, it will be appreciated that modifications and variations of the present invention are covered by the above teachings and are within the purview of the appended claims without departing from the spirit and intended scope of the invention.

All the features disclosed in this specification (including any accompanying claims, abstract and drawings), and/or all of the steps of any method or process so disclosed, may be combined in any combination, except for combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A method of etching a dielectric structure comprising:
providing a dielectric structure comprising (a) a first dielectric layer of undoped silicon oxide or F-doped silicon oxide; and (b) a second dielectric layer of C,H-doped silicon oxide over said first dielectric layer; and
etching said dielectric structure in a plasma-etching step, wherein said plasma-etching step is conducted using a plasma source gas that comprises nitrogen atoms and fluorine atoms, and wherein said second dielectric layer is selectively etched relative to said first dielectric layer in said etching step, thereby avoiding the need for an intervening etch stop layer between said first and second dielectric layers.

2. The method of claim 1, wherein said plasma source gas comprises a gaseous species that comprises one or more nitrogen atoms and one or more fluorine atoms.

3. The method of claim 2, wherein the gaseous species is $NF_3$.

4. The method of claim 1, wherein said plasma source gas comprises (a) a gaseous species that comprises one or more nitrogen atoms and (b) a gaseous species that comprises one or more fluorine atoms.

5. The method of claim 4, wherein said plasma source gas comprises $N_2$ and a fluorocarbon gas.

6. The method of claim 5, wherein said fluorocarbon gas is $CF_4$.

7. The method of claim 1, wherein said first dielectric layer is an undoped silicon dioxide layer.

8. The method of claim 1, wherein said first dielectric layer is a fluorinated silica glass layer.

9. The method of claim 1, wherein said plasma-etching step provides a second-dielectric-layer:first-dielectric-layer selectivity of 2.5:1 or greater.

10. The method of claim 1, wherein said plasma-etching step provides a second-dielectric-layer:first-dielectric-layer selectivity of 3:1 or greater.

11. The method of claim 1, wherein said plasma-etching step is conducted within a magnetically enhanced reactive ion etching system.

12. A method of etching a trench in a dual damascene structure, said method comprising:

providing a dual damascene structure comprising (a) an underlying layer, (b) a via dielectric layer of undoped silicon oxide or F-doped silicon oxide over said underlying layer, (c) a trench dielectric layer of C,H-doped silicon oxide over said via dielectric layer, and (d) a patterned masking layer over said trench dielectric layer; and etching one or more trenches in said trench dielectric layer through apertures in said patterned masking layer in a plasma-etching step until a portion of an upper surface of said via dielectric layer is exposed, wherein said plasma-etching step is conducted using a plasma source gas that comprises nitrogen atoms and fluorine atoms and wherein said trench dielectric layer is selectively etched relative to said via dielectric layer in said plasma-etching step.

13. The method of claim 12, wherein said dual damascene structure comprises an extended via hole that extends through said trench dielectric layer and said via dielectric layer.

14. The method of claim 12, wherein said plasma source gas comprises a gaseous species that comprises at least one nitrogen atom and at least one fluorine atom.

15. The method of claim 14, wherein the gaseous species is $NF_3$.

16. The method of claim 12, wherein said plasma source gas comprises: (a) a gaseous species that comprises one or more nitrogen atoms and (b) a gaseous species that comprises one or more fluorine atoms.

17. The method of claim 16, wherein said plasma source gas comprises $N_2$ gas and a fluorocarbon gas.

18. The method of claim 12, wherein said via dielectric layer is an undoped silicon dioxide layer.

19. The method of claim 12, wherein said via dielectric layer is a fluorinated silica glass layer.

20. The method of claim 12, wherein said plasma-etching step provide a trench-dielectric-layer:via-dielectric-layer selectivity of 3:1 or greater.

21. The method of claim 12, wherein said plasma-etching step is conducted within a magnetically enhanced reactive ion etching system.

22. The method of claim 1, wherein said second dielectric layer of C,H-doped silicon oxide is formed using a plasma-assisted chemical vapor deposition process.

23. The method of claim 12, wherein said trench dielectric layer of C,H-doped silicon oxide is formed using a plasma-assisted chemical vapor deposition process.

24. The method of claim 20, wherein said trench dielectric layer of C,H-doped silicon oxide is formed using a plasma-assisted chemical vapor deposition process.

* * * * *